(12) United States Patent
Kubo

(10) Patent No.: US 11,230,779 B2
(45) Date of Patent: Jan. 25, 2022

(54) SUBSTRATE PLATING METHOD

(71) Applicant: SHINKO ELECTRIC INDUSTRIES CO., LTD., Nagano (JP)

(72) Inventor: Katsuya Kubo, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 12 days.

(21) Appl. No.: 16/880,091

(22) Filed: May 21, 2020

(65) Prior Publication Data
US 2020/0378026 A1      Dec. 3, 2020

(30) Foreign Application Priority Data

May 31, 2019 (JP) .............................. JP2019-102986

(51) Int. Cl.
  *C25D 3/38*   (2006.01)
  *C25D 5/02*   (2006.01)
  *H05K 3/18*   (2006.01)

(52) U.S. Cl.
  CPC .............. *C25D 3/38* (2013.01); *C25D 5/022* (2013.01); *H05K 3/188* (2013.01)

(58) Field of Classification Search
  CPC ................................ C25D 5/022; H05K 3/188
  See application file for complete search history.

(56) References Cited

FOREIGN PATENT DOCUMENTS

| JP | 2000-252627 | 9/2000 |
| JP | 2003309214 A | * 10/2003 |

OTHER PUBLICATIONS

Kobayashi, Machine Translation JP-2003309214-A (Year: 2003).*

* cited by examiner

*Primary Examiner* — Ho-Sung Chung
(74) *Attorney, Agent, or Firm* — Rankin, Hill & Clark LLP

(57) ABSTRACT

A substrate plating method includes forming a first resist film exposing a first feeding layer on a first face of a substrate; forming a second resist film exposing a second feeding layer on a second face of the substrate opposite to the first face; holding the substrate with a clamp member in such a manner that the clamp member is in contact with the first feeding layer and the second feeding layer, and arranging a first electrode in opposed relation with the first face and a second electrode in opposed relation with the second face; and forming a plating layer on a plating-scheduled region of the first face under conditions in which a value of current supplied between the second face and the second electrode is larger than a value of current supplied between the first face and the first electrode.

7 Claims, 8 Drawing Sheets

SUBSTRATE PLATING METHOD

CROSS-REFERENCE TO RELATED APPLICATION

This application is based upon and claims the benefit of priority of the prior Japanese Patent Application No. 2019-102986, filed on May 31, 2019, the entire contents of which are incorporated herein by reference.

FIELD

The embodiment discussed herein is related to a substrate plating method.

BACKGROUND

Electrolytic plating is a conventional method for forming a plating layer on a substrate. In the electrolytic plating method, a resist film is formed on the substrate surface in such a manner that the resist film will have openings on plating-scheduled regions of the substrate surface and will also expose a feeding layer in the outer edge of the substrate surface. The feeding layer is clamped by a clamp member and the substrate is immersed into a plating bath. While holding the substrate with the clamp member, an electrode is arranged in opposed relation with the substrate surface. When a current is supplied between the substrate surface and the electrode in the plating bath, a plating layer is formed on the plating-scheduled regions of the substrate surface through the resist film as a mask. The plating layer is used as, for example, external connection terminals such as bumps. Japanese Laid-open Patent Publication No. 2000-252627 is an example of related art.

When a current is supplied between an electrode and a substrate that is held with a clamp member in a plating bath, a plating layer is formed not only on the plating-scheduled regions of the substrate surface but also on the clamp member. Due to this fact, the portion of the substrate surface in the vicinity of the clamp member is plated at a lower rate. Consequently, the plating layer has a smaller thickness on the substrate surface near the clamp member, that is, the plating layer has a variation in thickness in the plane of the substrate. When the plating layer is used as, for example, external connection terminals such as bumps, a variation in thickness of the plating layer in the plane of the substrate is an undesirable factor that lowers the reliability of connection between the external connection terminals and external components that are connected to the external connection terminals.

SUMMARY

According to an aspect of an embodiment, a substrate plating method includes: forming a first resist film on a first face of a substrate in such a manner that the first resist film has an opening on a plating-scheduled region of the first face and exposes a first feeding layer in at least a portion of an outer edge of the first face; forming a second resist film on a second face of the substrate opposite to the first face in such a manner that the second resist film exposes a second feeding layer in at least a portion of an outer edge of the second face; holding the substrate with a clamp member in such a manner that the clamp member is in contact with the first feeding layer and the second feeding layer, and arranging a first electrode in opposed relation with the first face of the substrate and a second electrode in opposed relation with the second face of the substrate; and forming a plating layer on the plating-scheduled region of the first face while using the first resist film as a mask under conditions in which a value of current supplied between the second face of the substrate and the second electrode is larger than a value of current supplied between the first face of the substrate and the first electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An embodiment of the substrate plating method disclosed herein will be described in detail hereinbelow based on the accompanying drawings. However, it should be construed that the scope of the technique disclosed herein is not limited by such an embodiment.

Substrate Plating Method

Figure 1:
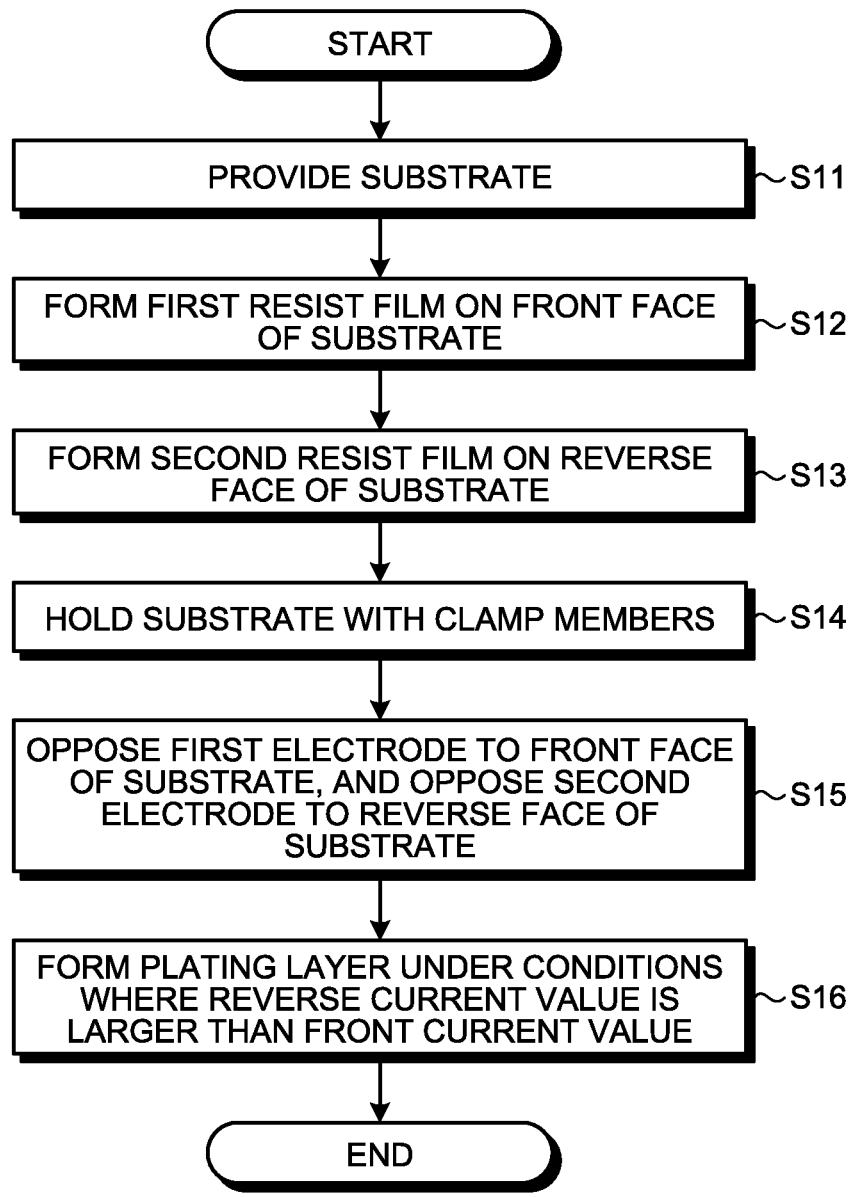
FIG. 1 is a flowchart illustrating an example of a substrate plating method according to an embodiment.

FIG. 1 is a flowchart illustrating an example of a substrate plating method according to the embodiment.

Figure 2:
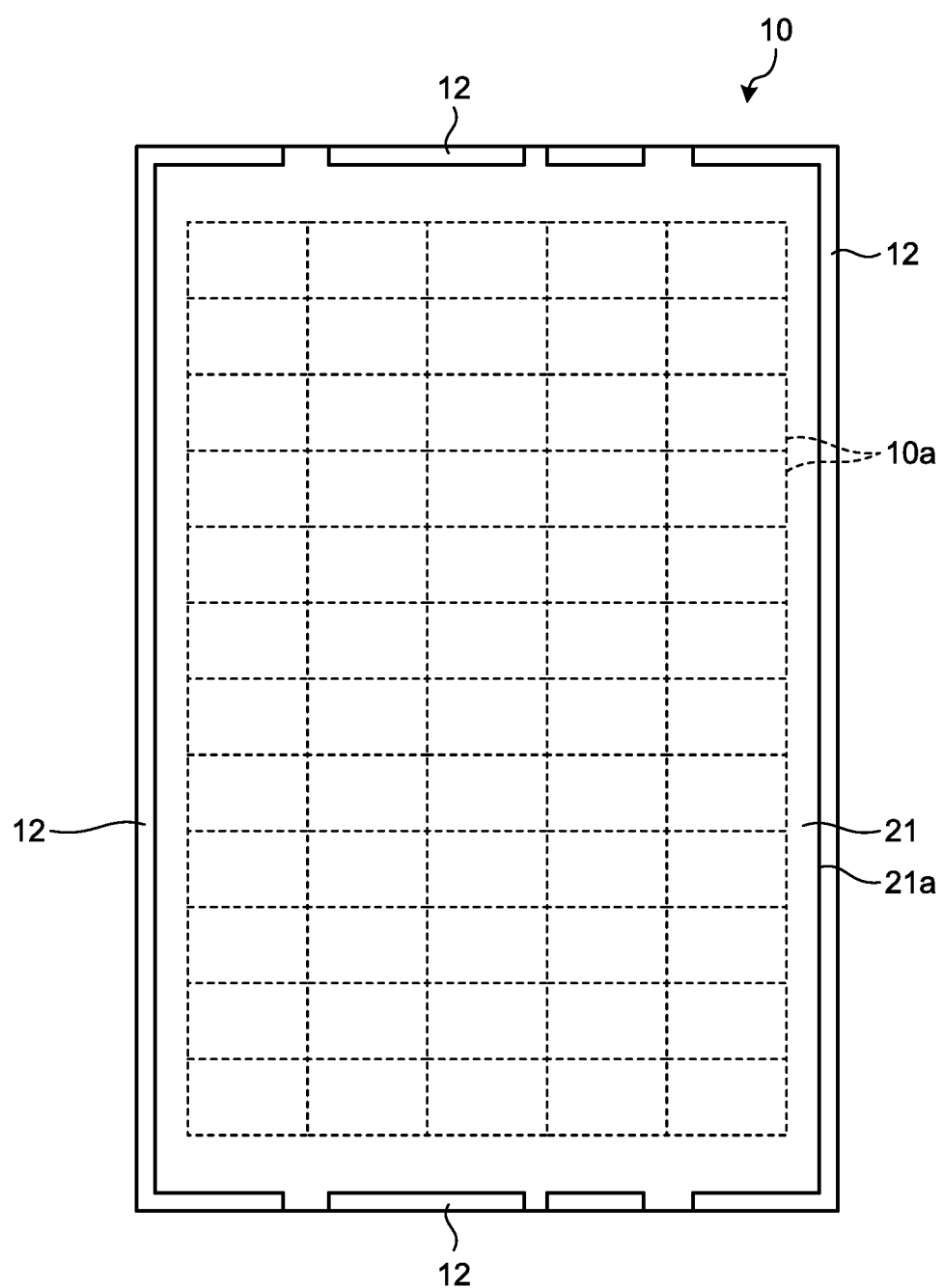
FIG. 2 is a plan view illustrating an example of a configuration on a front face of a substrate.
Figure 3:
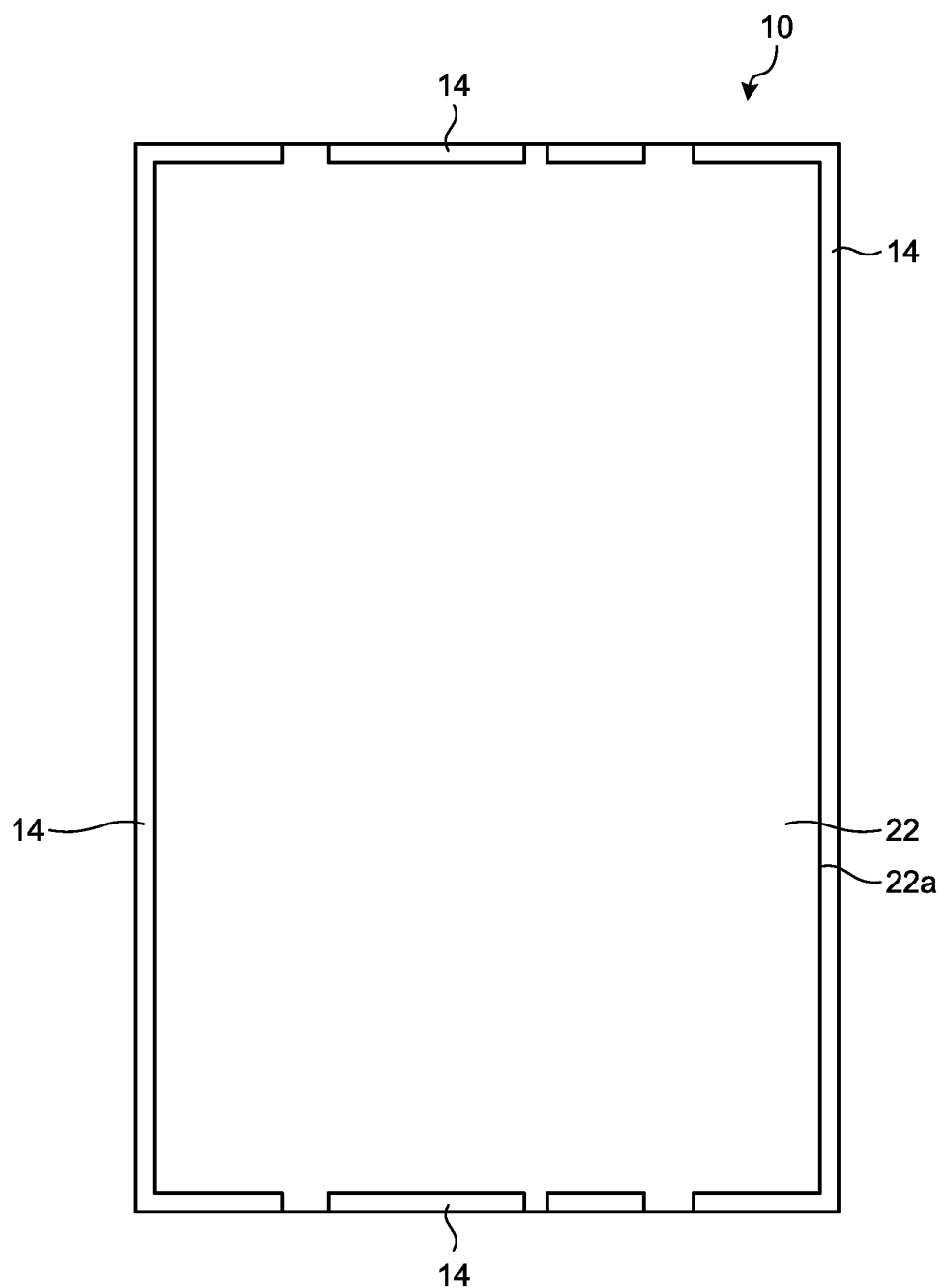
FIG. 3 is a plan view illustrating an example of a configuration on a reverse face of a substrate.

First, a substrate 10 (see FIG. 2 and FIG. 3 presented later) is provided (Step S11). The substrate 10 has a substantially rectangular shape in plan view. One of the faces of the substrate 10 has plating-scheduled regions on which a plating layer will be formed. For example, the plating-scheduled regions may be wiring layers or seed layers formed in a predetermined pattern. In the following, the face on which the plating-scheduled regions are disposed will be referred to as the "front face". The front face is an example of a first face. On the outer edge of the front face of the substrate 10, a first feeding layer 12 (see FIG. 2) is disposed, which serves as a feeding point during the formation of a plating layer. Furthermore, a second feeding layer 14 (see FIG. 3) that serves as a feeding point during the formation of a plating layer is disposed on the reverse face of the substrate opposite to the front face. The reverse face is an example of a second face.

Next, a first resist film is formed on the front face of the substrate 10 (Step S12). Specifically, as illustrated in FIG. 2 for example, a first resist film 21 is formed on the front face of the substrate 10 in such a manner that the first resist film 21 will have openings corresponding to the locations of the plating-scheduled regions of the front face and will also expose a first feeding layer 12 in at least a portion of the outer edge of the front face. FIG. 2 is a plan view illustrating an example of the configuration on the front face of the substrate 10. For example, the first resist film 21 is formed by applying a photosensitive dry film resist onto the front face of the substrate 10, and photoexposing and developing the dry film resist applied. The central region of the front face of the substrate 10 is partitioned into a plurality of substrate sections 10a arranged in a matrix form. In the example illustrated in FIG. 2, the central region of the front face of the substrate 10 is partitioned into sixty substrate sections 10a in a matrix form consisting of twelve rows and five columns. The first resist film 21 has a plurality of openings (not shown) corresponding to a plurality of plating-scheduled regions in each of the substrate sections 10a. For example, each substrate section 10a has substantially circular openings in a matrix form corresponding to the locations in which external connection terminals will be formed. Furthermore, the first resist film 21 has a C-shaped cutout 21a that is disposed at a location corresponding to the complete periphery of the outer edge of the front face of the substrate 10 so as to expose the first feeding layer 12. The cutout 21a is divided into discontinuous portions. In the example illustrated in FIG. 2, the cutout 21a is divided into four portions on the two shorter sides of the front face of the substrate 10. The positions of the separate portions of the cutout 21a are determined in accordance with the positions of clamp members 52 described later (see FIG. 4).

Next, a second resist film is formed on the reverse face of the substrate 10 (Step S13). Specifically, as illustrated in FIG. 3 for example, a second resist film 22 is formed on the reverse face of the substrate 10 in such a manner that the second resist film 22 will expose a second feeding layer 14 in at least a portion of the outer edge of the reverse face. FIG. 3 is a plan view illustrating an example of the configuration on the reverse face of the substrate 10. For example, the second resist film 22 is formed by applying a photosensitive dry film resist onto the reverse face of the substrate 10, and photoexposing and developing the dry film resist applied. The second resist film 22 has a C-shaped cutout 22a that is disposed at a location corresponding to the complete periphery of the outer edge of the reverse face of the substrate 10 so as to expose the second feeding layer 14. The cutout 22a is divided into discontinuous portions. In the example illustrated in FIG. 3, the cutout 22a is divided into four portions on the two shorter sides of the reverse face of the substrate 10. The positions of the separate portions of the cutout 22a are determined in accordance with the positions of clamp members 52 described later (see FIG. 4).

Figure 4:
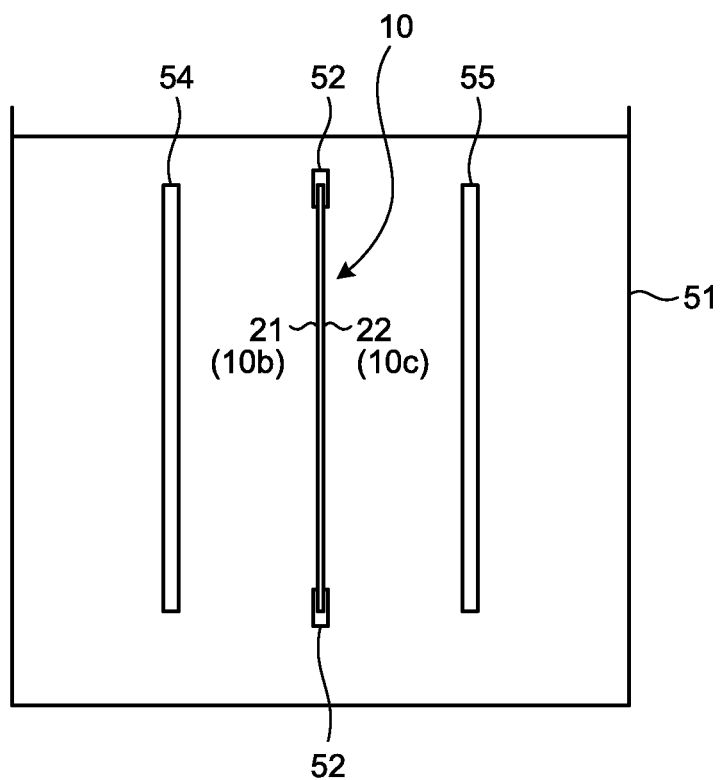
FIG. 4 is a view illustrating an example of holding of a substrate.

Next, the substrate 10 is held with clamp members 52 (Step S14). Specifically, as illustrated in FIG. 4 for example, the substrate 10 is held with the clamp members 52 in a plating bath 51 in such a manner that the clamp members 52 are in contact with the first feeding layer 12 and the second feeding layer 14 (see FIG. 2 and FIG. 3). FIG. 4 is a view illustrating an example of holding of the substrate 10. The plating bath 51 contains an electrolytic plating solution used to form a plating layer. The electrolytic plating solution may be, for example, a copper sulfate plating solution. The clamp members 52 are arranged on both the upper side and the lower side of the plating bath 51, and the substrate 10 is held with the clamp members 52 so that the two shorter sides of the front face (or the reverse face) of the substrate 10 will be located on the upper side and the lower side of the plating bath 51.

Next, a first electrode is arranged in opposed relation with the front face of the substrate 10 held with the clamp members 52, and a second electrode is arranged in opposed relation with the reverse face of the substrate 10 (Step S15). Specifically, as illustrated in FIG. 4 for example, in the plating bath 51, a first electrode 54 is arranged to face a front face 10b of the substrate 10, and a second electrode 55 is arranged to face a reverse face 10c of the substrate 10. The first electrode 54 and the second electrode 55 are anodes, and the substrate 10 is a cathode.

Next, a plating layer is formed on the plating-scheduled regions of the front face 10b of the substrate 10 through the first resist film 21 as a mask under conditions in which the value of current supplied between the reverse face 10c and the second electrode 55 is larger than the value of current supplied between the front face 10b and the first electrode 54 (Step S16). For example, the plating layer is used as external connection terminals such as bumps. The metal material for forming the plating layer may be, for example, copper similarly to wiring layers. In the following, for the purpose of convenience, the value of current supplied between the front face 10b of the substrate 10 and the first electrode 54 will be appropriately written as the "front current value", and the value of current supplied between the reverse face 10c of the substrate 10 and the second electrode 55 will be appropriately written as the "reverse current value". The ratio of the reverse current value to the front current value is set so that a current will deflect from the reverse face 10c of the substrate 10 to the front face 10b. For example, the ratio of the reverse current value to the front current value is in the range of 1.5 to 3. For example, the front current value is set at 5 to 10 A, and the reverse current value at 7.5 to 20 A.

Figure 5:
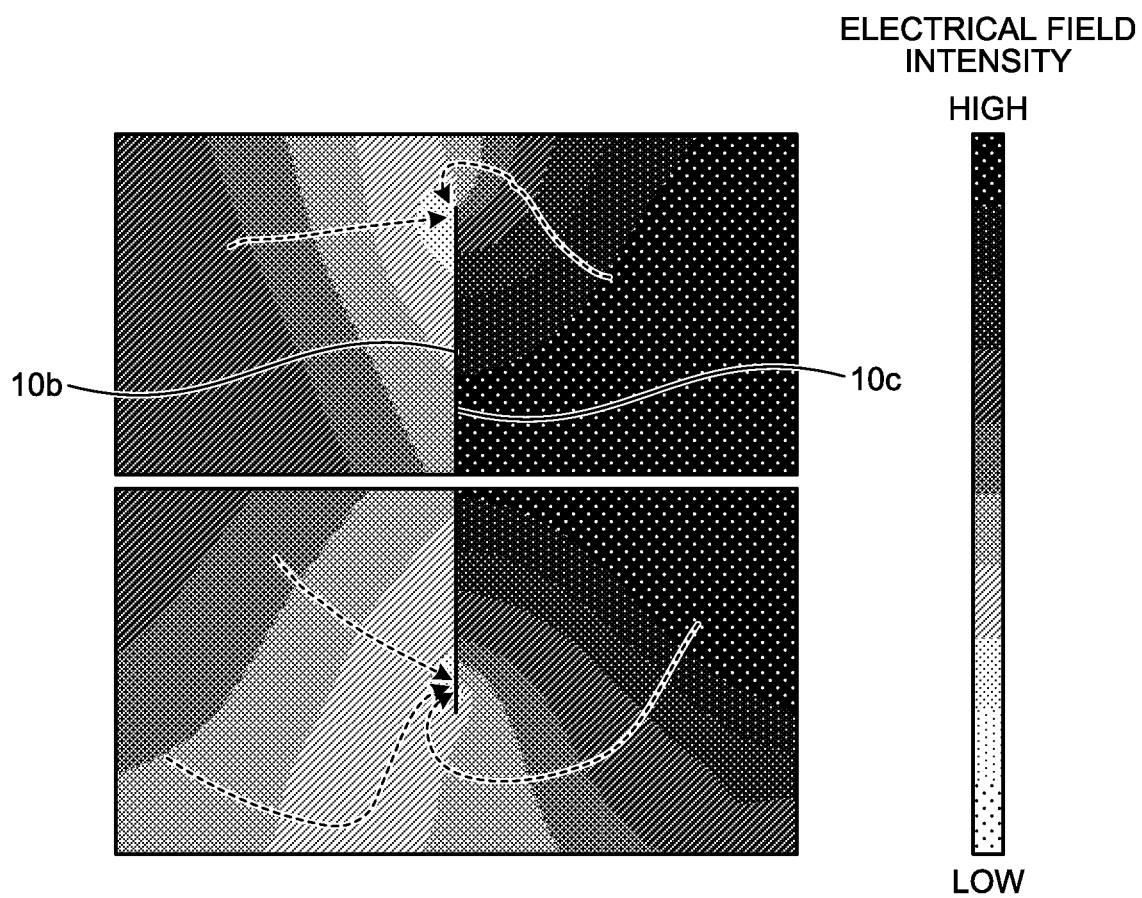
FIG. 5 is a view illustrating an example of results of the simulation of electrical field intensities around a front face and a reverse face of a substrate.

Here, the deflection of a current from the reverse face 10c of the substrate 10 to the front face 10b will be described with reference to FIG. 5. FIG. 5 is a view illustrating an example of the results of the simulation of electrical field intensities around the front face 10b and the reverse face 10c of the substrate 10. The upper side in FIG. 5 coincides with the upper side in the plating bath 51 (see FIG. 4), and the lower side in FIG. 5 coincides with the lower side in the plating bath 51. The simulation results shown in FIG. 5 correspond to a case where the reverse current value is larger than the front current value. When the reverse current value is larger than the front current value, a current is deflected from the reverse face 10c of the substrate 10 to the front face 10b. FIG. 5 illustrates the deflection of current from the reverse face 10c of the substrate 10 to the front face 10b in broken lines of electric force. As a result of a current being deflected from the reverse face 10c of the substrate 10 to the front face 10b, the metal ions contained in the electrolytic plating solution in the plating bath 51 are stably supplied to the front face 10b. Consequently, a plating layer is formed on the plating-scheduled regions of the front face 10b of the substrate 10 and is also formed on the clamp members 52 holding the substrate 10 in the presence of metal ions being replenished to the vicinity of the clamp members 52 on the front face 10b in the electrolytic plating solution. As a result, the plating layer near the clamp members 52 on the front face 10b of the substrate 10 gains an increased thickness to make it possible to render more uniform the thickness of the plating layer through the entirety of the front face 10b of the substrate 10.

Figure 6:
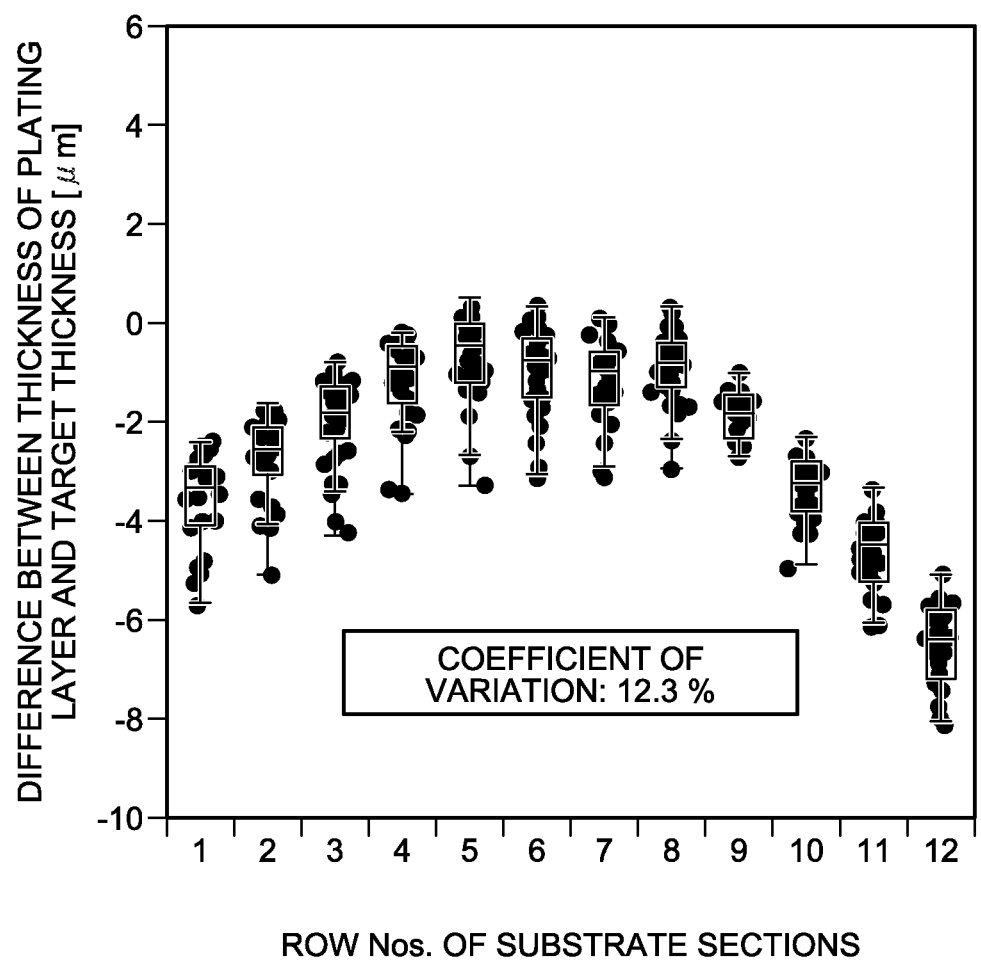
FIG. 6 is a diagram illustrating an example of the thickness distribution in a plating layer formed by a substrate coating method according to a comparative embodiment.

Next, FIG. 6 and FIG. 7 will be discussed, which illustrate examples of the results of measurement of thickness distribution in a plating layer on a front face 10b of a substrate 10. FIG. 6 is a diagram illustrating an example of the results of measurement of thickness distribution in a plating layer formed by a substrate plating method according to a comparative embodiment. The abscissa in FIG. 6 indicates the row Nos. (1 to 12) of substrate sections 10a (see FIG. 2). The closer the row Nos. are to "1" and "12", the closer the substrate sections 10a are to clamp members 52 on the front face 10b of the substrate 10. The closer the row Nos. are to "6" and "7", the more central the substrate sections 10a are located on the front face 10b of the substrate 10. The ordinate in FIG. 6 indicates the difference [μm] between the thickness of the plating layer formed on plating-scheduled regions in each substrate section 10a, and the target thickness. In the comparative embodiment, a first resist film 21 is formed on the front face 10b of the substrate 10, and thereafter a second resist film 22 is formed on the reverse face 10c of the substrate 10 so as to cover the entirety of the reverse face 10c. In this case, the entirety of the reverse face 10c of the substrate 10 is covered with the second resist film 22, and thus no second feeding layer 14 is exposed on the outer edge of the reverse face 10c of the substrate 10. Next, the substrate 10 is held with the clamp members 52 in such a manner that the clamp members 52 are in contact with a first feeding layer 12, and further a first electrode 54 is arranged to face the front face 10b of the substrate 10 and a second electrode 55 is arranged to face the reverse face 10c of the substrate 10. Next, a current is supplied only between the front face 10b of the substrate 10 and the first electrode 54, and thereby a plating layer is formed on the plating-scheduled regions of the front face 10b through the first resist film 21 as a mask. In the comparative embodiment, as illustrated in FIG. 6, the difference in thickness of the plating layer between the vicinity of the center of the front face 10b of the substrate 10 and the vicinity of the clamp member 52 on the front face 10b was about 8.5 μm, while the coefficient of variation is 12.3%. Incidentally, the coefficient of variation is a quotient of the standard deviation of the thickness of the plating layer divided by the average thickness of the plating layer, and indicates the degree of variation in the thickness of the plating layer.

Figure 7:
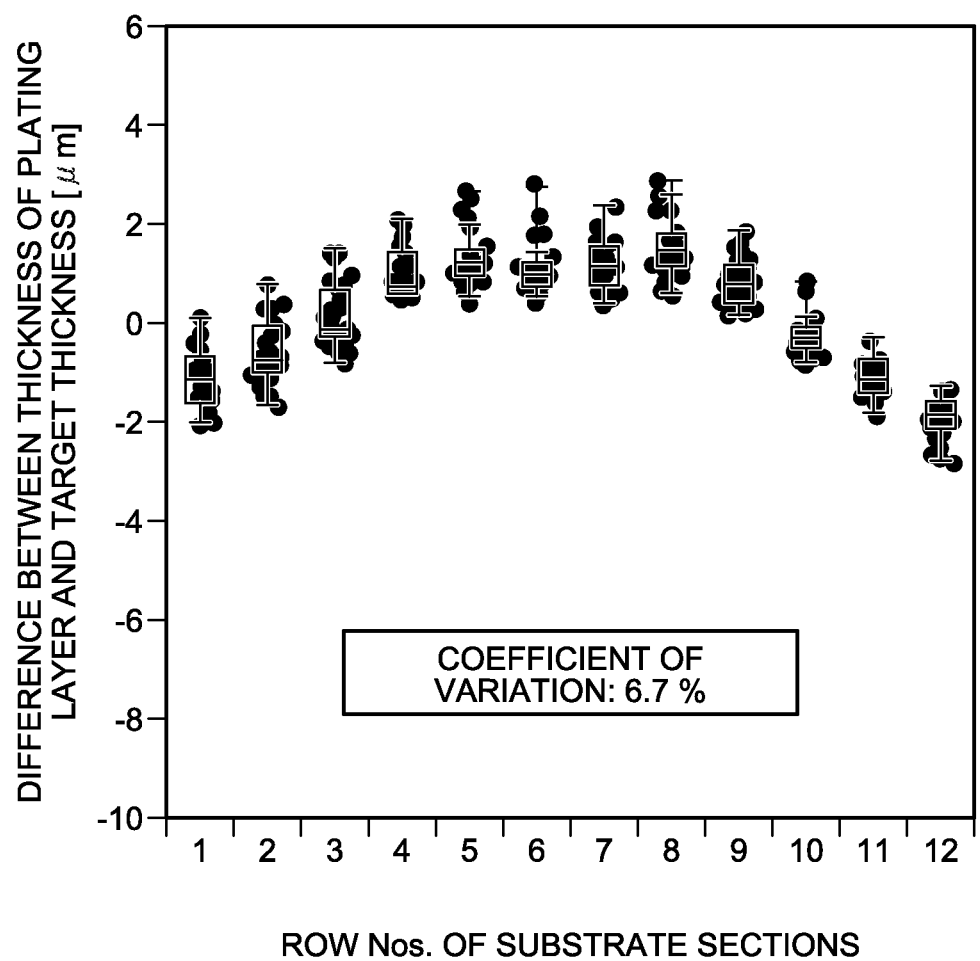
FIG. 7 is a diagram illustrating an example of the thickness distribution in a plating layer formed by a substrate coating method according to an embodiment.

FIG. 7 is a diagram illustrating an example of the results of measurement of thickness distribution in a plating layer formed by the substrate plating method according to the embodiment. The abscissa in FIG. 7 indicates the row Nos. (1 to 12) of substrate sections 10a (see FIG. 2). The closer the row Nos. are to "1" and "12", the closer the substrate sections 10a are to clamp members 52 on the front face 10b of the substrate 10. The closer the row Nos. are to "6" and "7", the more central the substrate sections 10a are located on the front face 10b of the substrate 10. The ordinate in FIG. 7 indicates the difference [μm] between the thickness of the plating layer formed on plating-scheduled regions in each substrate section 10a, and the target thickness. In the embodiment, as illustrated in FIG. 7, the difference in thickness of the plating layer between the vicinity of the center of the front face 10b of the substrate 10 and the vicinity of the clamp member 52 on the front face 10b was about 6 μm, while the coefficient of variation being 6.7%. In the embodiment, the difference in thickness of the plating layer was about 2.5 μm smaller and the coefficient of variation was decreased by as much as 5.6% compared to the comparative embodiment. Thus, the embodiment can reduce the variation in thickness of a plating layer compared to the comparative embodiment.

In the substrate plating method according to the embodiment, as discussed above, a first resist film is formed on a first face of a substrate in such a manner that the first resist film has openings on plating-scheduled regions of the first face and exposes a first feeding layer in at least a portion of the outer edge of the first face. In the plating method, next, a second resist film is formed on a second face of the substrate opposite to the first face in such a manner that the second resist film exposes a second feeding layer in at least a portion of the outer edge of the second face. In the plating method, next, the substrate is held with clamp members in such a manner that the clamp members are in contact with the first feeding layer and the second feeding layer, and a first electrode is arranged in opposed relation with the first face of the substrate and a second electrode is arranged in opposed relation with the second face of the substrate. In the plating method, next, a plating layer is formed on the plating-scheduled regions of the first face while using the first resist film as a mask under conditions in which the value of current supplied between the second face of the substrate and the second electrode is larger than the value of current supplied between the first face of the substrate and the first electrode. In this manner, the plating layer near the clamp members on the first face of the substrate gains an increased thickness to make it possible to reduce the variation in thickness of the plating layer in the plane of the substrate.

In the substrate plating method according to the embodiment, the second resist film has a C-shaped cutout that is disposed at a location corresponding to the complete periphery of the outer edge of the second face so as to expose the second feeding layer. This configuration allows a plating layer to gain an increased thickness through the entirety of the first face of the substrate.

The embodiment disclosed herein is only illustrative in all aspects and should not be construed as being limiting in any way. The embodiment discussed above may be omitted, replaced or modified in various manners without departing from the scope and spirit as set forth in the appended claims.

Figure 8:
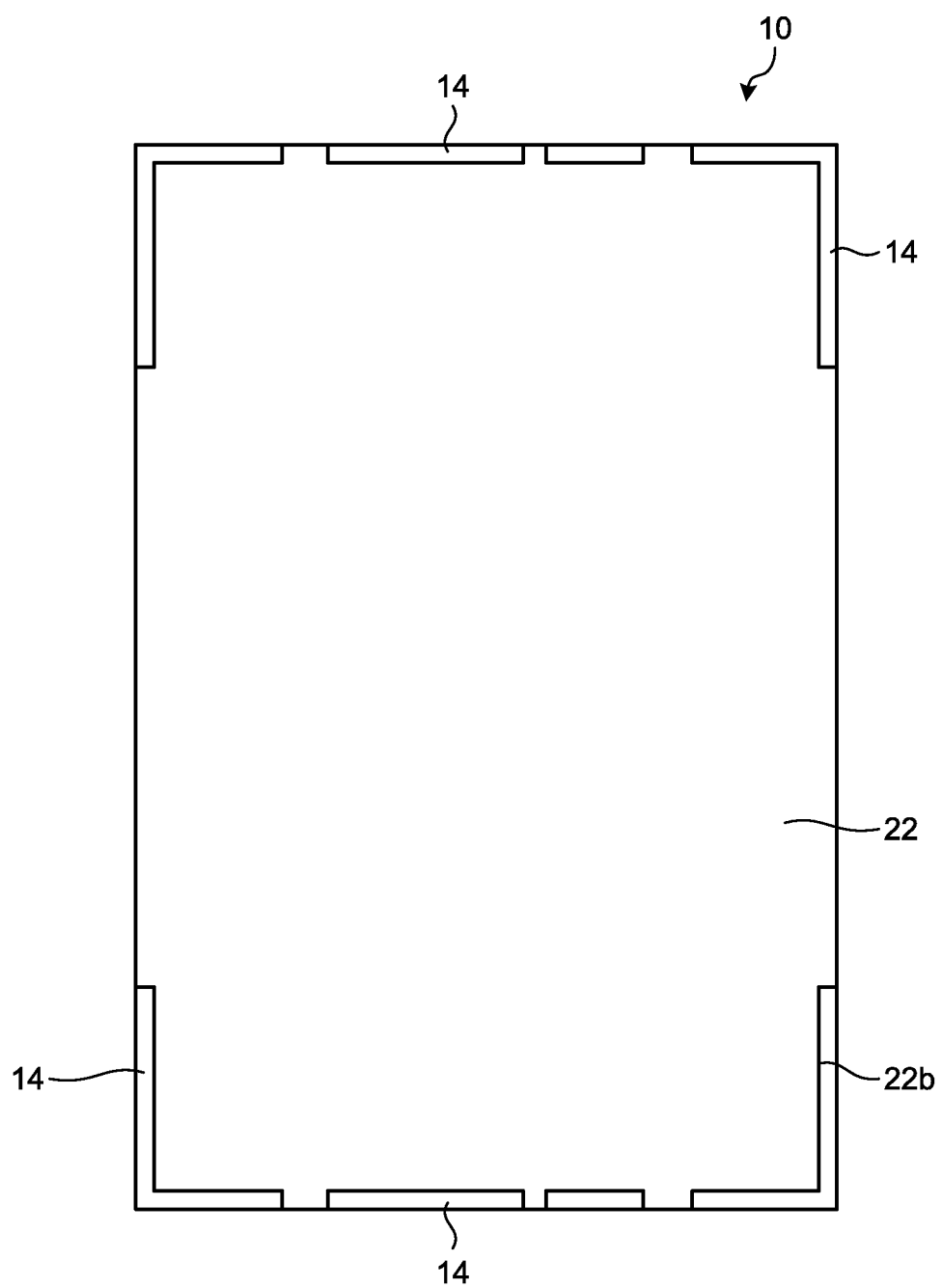
FIG. 8 is a plan view illustrating another example of a configuration on a reverse face of a substrate.

For example, while the above embodiment has illustrated the second resist film 22 as having a C-shaped cutout 22a that is disposed at a location corresponding to the complete periphery of the outer edge of the reverse face of the substrate 10 so as to expose the second feeding layer 14, the technique disclosed herein is not limited thereto. For example, as illustrated in FIG. 8, the second resist film 22 may have, on the outer edge of the reverse face of the substrate 10, substantially L-shaped cutouts 22b that are each disposed at a location corresponding to a portion along one shorter side of the reverse face that is to be intersected by the clamp member 52 and along the two longer sides that are continuous to that shorter side, and that each expose the second feeding layer 14. FIG. 8 is a plan view illustrating another example of the configuration on the reverse face of the substrate 10. As a result of the second resist film 22 having substantially L-shaped cutouts 22b, the deflection of current from the reverse face of the substrate 10 to the front face is concentrated at the vicinity of the clamp members 52 on the front face. Consequently, the growth of a plating layer is promoted in the vicinity of the clamp members 52 on the front face of the substrate 10, and thus the variation in thickness of the plating layer in the plane of the substrate 10 can be reduced. Furthermore, for example, the second resist film 22 may have, on the outer edge of the reverse face of the substrate 10, substantially linear cutouts that are each disposed at a location corresponding to one shorter side of the reverse face that will be intersected by the clamp member 52, and that each expose the second feeding layer 14.

Furthermore, while the above embodiment has illustrated the cutout 21a and the cutout 22a as being each divided into discontinuous portions, the technique disclosed herein is not limited thereto. For example, the cutout 21a and the cutout 22a may be each continuous.

The substrate plating method according to an aspect disclosed herein can effectively reduce the variation in thickness of a plating layer in the plane of a substrate.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A substrate plating method comprising:
    forming a first resist film on a first face of a substrate in such a manner that the first resist film has an opening on a plating-scheduled region of the first face and exposes a first feeding layer in at least a portion of an outer edge of the first face;
    forming a second resist film on a second face of the substrate opposite to the first face in such a manner that the second resist film exposes a second feeding layer in at least a portion of an outer edge of the second face;
    holding the substrate with a clamp member in such a manner that the clamp member is in contact with the first feeding layer and the second feeding layer, and arranging a first electrode in opposed relation with the first face of the substrate and a second electrode in opposed relation with the second face of the substrate; and
    forming a plating layer on the plating-scheduled region of the first face while using the first resist film as a mask under conditions in which a value of current supplied between the second face of the substrate and the second electrode is larger than a value of current supplied between the first face of the substrate and the first electrode.

2. The substrate plating method according to claim 1, wherein the second resist film has a C-shaped cutout that is disposed at a location corresponding to complete periphery of the outer edge of the second face, and that exposes the second feeding layer.

3. The substrate plating method according to claim 1, wherein the second resist film has an L-shaped cutout that is disposed, on the outer edge of the second face, at a location corresponding to a portion along one side of the second face that is to be intersected by the clamp member and along other two sides that are continuous to the one side, and that exposes the second feeding layer.

4. The substrate plating method according to claim 1, wherein the value of current supplied between the first face of the substrate and the first electrode is set at 5 to 10 A, and the value of current supplied between the second face of the substrate and the second electrode is set at 7.5 to 20 A.

5. The substrate plating method according to claim 1, wherein a ratio of the value of current supplied between the second face of the substrate and the second electrode to the value of current supplied between the first face of the substrate and the first electrode is in a range of 1.5 to 3.

6. The substrate plating method according to claim 1, wherein the second resist film has an opening only in a portion of an outer edge of the second face.

7. The substrate plating method according to claim 1, wherein the substrate has a rectangular shape in plan view, and the holding includes holding each of two opposed shorter sides of the rectangular shape with the clamp member.

* * * * *